US011709074B2

(12) United States Patent
Scoggins

(10) Patent No.: US 11,709,074 B2
(45) Date of Patent: Jul. 25, 2023

(54) SYSTEM AND METHOD FOR IMPROVED ACCURACY OF DETECTING METER REMOVAL OR PHYSICAL TAMPERING

(71) Applicant: Honeywell International Inc., Morris Plains, NJ (US)

(72) Inventor: Sean Scoggins, Rolesville, NC (US)

(73) Assignee: Honeywell International Inc., Charlotte, NC (US)

( * ) Notice: Subject to any disclaimer, the term of this patent is extended or adjusted under 35 U.S.C. 154(b) by 259 days.

(21) Appl. No.: 17/143,410

(22) Filed: Jan. 7, 2021

(65) Prior Publication Data

US 2022/0214191 A1 Jul. 7, 2022

(51) Int. Cl.
*G01D 3/08* (2006.01)
*G06N 20/00* (2019.01)
*G01D 4/00* (2006.01)
*G01R 11/24* (2006.01)

(52) U.S. Cl.
CPC .............. *G01D 3/08* (2013.01); *G01D 4/002* (2013.01); *G01R 11/24* (2013.01); *G06N 20/00* (2019.01)

(58) Field of Classification Search
CPC .......... G01D 3/08; G01D 4/002; G06N 20/00; G01R 11/24
See application file for complete search history.

(56) References Cited

U.S. PATENT DOCUMENTS

| 6,654,697 | B1 | 11/2003 | Eryurek et al. |
| 8,322,215 | B2 | 12/2012 | Lakich et al. |
| 2011/0050045 | A1 | 3/2011 | Addy |
| 2012/0060606 | A1* | 3/2012 | Lakich ................. G01R 22/066 73/514.16 |
| 2015/0081129 | A1 | 3/2015 | Xu et al. |

(Continued)

FOREIGN PATENT DOCUMENTS

CN 109597014 A 4/2019

OTHER PUBLICATIONS

Patrick Glauner, Jorge Augusto Meira, Petko Valtchev, Radu State, and Franck Bettinger; "The Challenge of Non-Technical Loss Detection Using Artificial Intelligence: A Survey"; International Journal of Computational Intelligence Systems, vol. 10 (2017) 760-775.

(Continued)

*Primary Examiner* — Bryan Bui
(74) *Attorney, Agent, or Firm* — Ortiz & Lopez, PLLC; Kermit D. Lopez; Luis M. Ortiz

(57) ABSTRACT

Methods and system for detecting tampering of a meter. A continuous stream of raw sensor values can be received from one or more meters among a group of meters. In response to receiving the continuous stream of raw sensor values from the meter(s), a model of normal sensor values can be automatically constructed for each meter among the group of meters based on the raw sensor values obtained from the meter(s) and based on data obtained through an ongoing development of the meter(s) or through automated machine learning by the meter(s). The model of normal sensor values can be used to detect abnormal conditions with respect to the meter(s). The abnormal conditions detected with respect to the meter(s) are potentially indicative of a removal of the meter(s) or of an attempt to physically tamper with the meter(s).

20 Claims, 5 Drawing Sheets

(56) References Cited

U.S. PATENT DOCUMENTS

2020/0319249 A1   10/2020  Schamber et al.
2022/0101456 A1*  3/2022  Schönfeld ............. F24H 9/2007

OTHER PUBLICATIONS

Jatinder Singh, Julia Powles, Thomas Pasquier, and Jean Bacon; "Seeing through the clouds: Managing data flow and compliance in cloud computing"; Edited version published as "Data Flow Management and Compliance in Cloud Computing" in Cloud Computing, Special Issue on Legal Clouds. Available: http://ieeexplore.ieee.org/xpl/articleDetails.jsp?arnumber-7270240, No date.

Michael Armbrust, Armando Fox, Rean Griffith, Anthony D. Joseph, Randy Katz, Andy Conwinski, Gunho Lee, David Patterson, Ariel Rabkin, Ion Stoica, and Matei Zaharia; "A View of Cloud Computing"; DOI:10.1145/1721654.1721672; Communications of the ACM | Apr. 2010 | vol. 53 | No. 4.

"Cloud Computing", Wikipedia, Retrieved from "https://en.wikipedia.org/w/index.php? title=Cloud_computing&oldid=988968635", page last edited on Nov. 16, 2020, at 08:41 (UTC).

\* cited by examiner

SYSTEM AND METHOD FOR IMPROVED ACCURACY OF DETECTING METER REMOVAL OR PHYSICAL TAMPERING

TECHNICAL FIELD

Embodiments relate to utility meters including residential utility meters. Embodiments further relate to methods, systems, and devices for detecting the removal or physical tampering of a utility meter.

BACKGROUND

It is important for utilities to detect the unauthorized removal of an electricity meter from its socket or a gas index from its meter mounting because this is a common means of tampering with revenue meters. Various technologies have been deployed to attempt to address this by providing a signal (from a communicating meter) that it has been moved. Examples include mechanical tilt switches (e.g., "ball in cup" switches), vibration or mechanical shock sensors, and—more recently—accelerometers.

Mechanical tilt switches are not sensitive enough and can be easily overcome by tamperers. Vibration sensors and accelerometers can produce a constant signal and the actual removal condition must be deduced from this signal. They are both subject to considerable noise. The current state of the art involves applying a threshold to the sensor data—a vibration rate above some threshold, or acceleration above some threshold of time or magnitude—and if the signal exceeds this threshold at the time power is lost (for electricity meters), that combination of conditions is taken to indicate a meter removal.

Unfortunately, because of the many and varied field conditions around a deployed meter, this approach is too simple and can lead to many false positives once deployed. It does not appear that there is a globally "correct" threshold that can both detect all meter removals and also reject false positives, and currently no means to determine the best threshold a-priori.

BRIEF SUMMARY

The following summary is provided to facilitate an understanding of some of the features of the disclosed embodiments and is not intended to be a full description. A full appreciation of the various aspects of the embodiments disclosed herein can be gained by taking the specification, claims, drawings, and abstract as a whole.

It is, therefore, one aspect of the disclosed embodiments to provide for methods and systems for detecting the removal or physical tampering of a utility meter.

It is another aspect of the disclosed embodiments to provide for methods and systems for the development of model for detecting abnormalities associated with a utility meter including a removal or physical tampering of the utility meter.

It is a further aspect of the disclosed embodiments to provide for the development of a model for each utility meter among a group of utility meters based on local condition, wherein the model is used to detect abnormalities associated with the utility meter.

The aforementioned aspects and other objectives can now be achieved as described herein. In an embodiment, a method for detecting tampering of a meter, can involve: receiving a continuous stream of raw sensor values from at least one meter among a plurality of meters; in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

An embodiment of the method can further involve detecting the abnormal conditions with respect to the at least one meter by comparing abnormal conditions against the model of normal sensor values.

In an embodiment of the method, the at least one meter can comprise an electrical meter.

In an embodiment of the method, the at least one meter can comprise a gas meter.

In an embodiment of the method, the at least one meter can comprise at least one of: an electrical meter and/or a gas meter.

In an embodiment of the method, the model of normal sensor values can be further constructed based on data obtained external to the at least one meter.

In an embodiment of the method, the data obtained external to the at least one meter can comprise at least one of: temperature data; weather data; and outage data associated with meters located near the at least one meter.

In an embodiment, a system for detecting tampering of a meter, can include at least one processor and a non-transitory computer-usable medium embodying computer program code, the computer-usable medium capable of communicating with the at least one processor. The computer program code can include instructions executable by the at least one processor and operable for: receiving a continuous stream of raw sensor values from at least one meter among a plurality of meters; in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

In an embodiment of the system, the instructions can be further operable for detecting the abnormal conditions with respect to the at least one meter by comparing abnormal conditions against the model of normal sensor values.

In an embodiment of the system, at least one meter can comprise an electrical meter.

In an embodiment of the system, the at least one meter can comprise a gas meter.

In an embodiment of the system, the at least one meter can comprise at least one of: an electrical meter and/or a gas meter.

In an embodiment of the system, the model of normal sensor values can be further constructed based on data obtained external to the at least one meter.

In an embodiment of the system, the data obtained external to the at least one meter can comprise at least one of: temperature data, weather data, and outage data associated with meters located near the at least one meter.

In an embodiment, a utility meter system for detecting tampering of a meter, can include: at least one meter among a plurality of meters, wherein a continuous stream of raw sensor values is received from the at least one meter among the plurality of meters; a model of normal sensor values, wherein in response to receiving the continuous stream of raw sensor values from the at least one meter, the model of normal sensor values is automatically constructed for each meter among the plurality of meters based on the raw sensor values obtained from the at least one meter among the plurality of meters and based on data obtained through an ongoing development of the at least one meter or through automated machine learning by the at least one meter; wherein the model of normal sensor values is used to detect abnormal conditions with respect to the at least one meter; and wherein at least some of the abnormal conditions detected with respect to the at least one meter are potentially indicative of a removal of the at least one meter or of an attempt to physically tamper with the at least one meter.

In an embodiment of the utility meter system, the abnormal conditions with respect to the at least one meter can be detected by comparing abnormal conditions against the model of normal sensor values.

In an embodiment of the utility meter system, the model of normal sensor values can be further constructed based on data obtained external to the at least one meter.

In an embodiment of the utility meter system, the at least one meter can comprise at least one of an electrical meter and/or a gas meter.

In an embodiment of the utility meter system, the data obtained external to the at least one meter can comprise one or more of: temperature data, weather data, and outage data associated with meters located near the at least one meter.

BRIEF DESCRIPTION OF THE DRAWINGS

The accompanying figures, in which like reference numerals refer to identical or functionally-similar elements throughout the separate views and which are incorporated in and form a part of the specification, further illustrate the present invention and, together with the detailed description of the invention, serve to explain the principles of the present invention.

DETAILED DESCRIPTION

The particular values and configurations discussed in these non-limiting examples can be varied and are cited merely to illustrate one or more embodiments and are not intended to limit the scope thereof.

Subject matter will now be described more fully hereinafter with reference to the accompanying drawings, which form a part hereof, and which show, by way of illustration, specific example embodiments. Subject matter may, however, be embodied in a variety of different forms and, therefore, covered or claimed subject matter is intended to be construed as not being limited to any example embodiments set forth herein; example embodiments are provided merely to be illustrative. Likewise, a reasonably broad scope for claimed or covered subject matter is intended. Among other issues, subject matter may be embodied as methods, devices, components, or systems. Accordingly, embodiments may, for example, take the form of hardware, software, firmware, or a combination thereof. The following detailed description is, therefore, not intended to be interpreted in a limiting sense.

Throughout the specification and claims, terms may have nuanced meanings suggested or implied in context beyond an explicitly stated meaning. Likewise, phrases such as "in one embodiment" or "in an example embodiment" and variations thereof as utilized herein may not necessarily refer to the same embodiment and the phrase "in another embodiment" or "in another example embodiment" and variations thereof as utilized herein may or may not necessarily refer to a different embodiment. It is intended, for example, that claimed subject matter include combinations of example embodiments in whole or in part.

In general, terminology may be understood, at least in part, from usage in context. For example, terms such as "and," "or," or "and/or" as used herein may include a variety of meanings that may depend, at least in part, upon the context in which such terms are used. Generally, "or" if used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. Similarly, terms such as "a," "an," or "the", again, may be understood to convey a singular usage or to convey a plural usage, depending at least in part upon context. In addition, the term "based on" may be understood as not necessarily intended to convey an exclusive set of factors and may, instead, allow for existence of additional factors not necessarily expressly described, again, depending at least in part on context.

Figure 1:
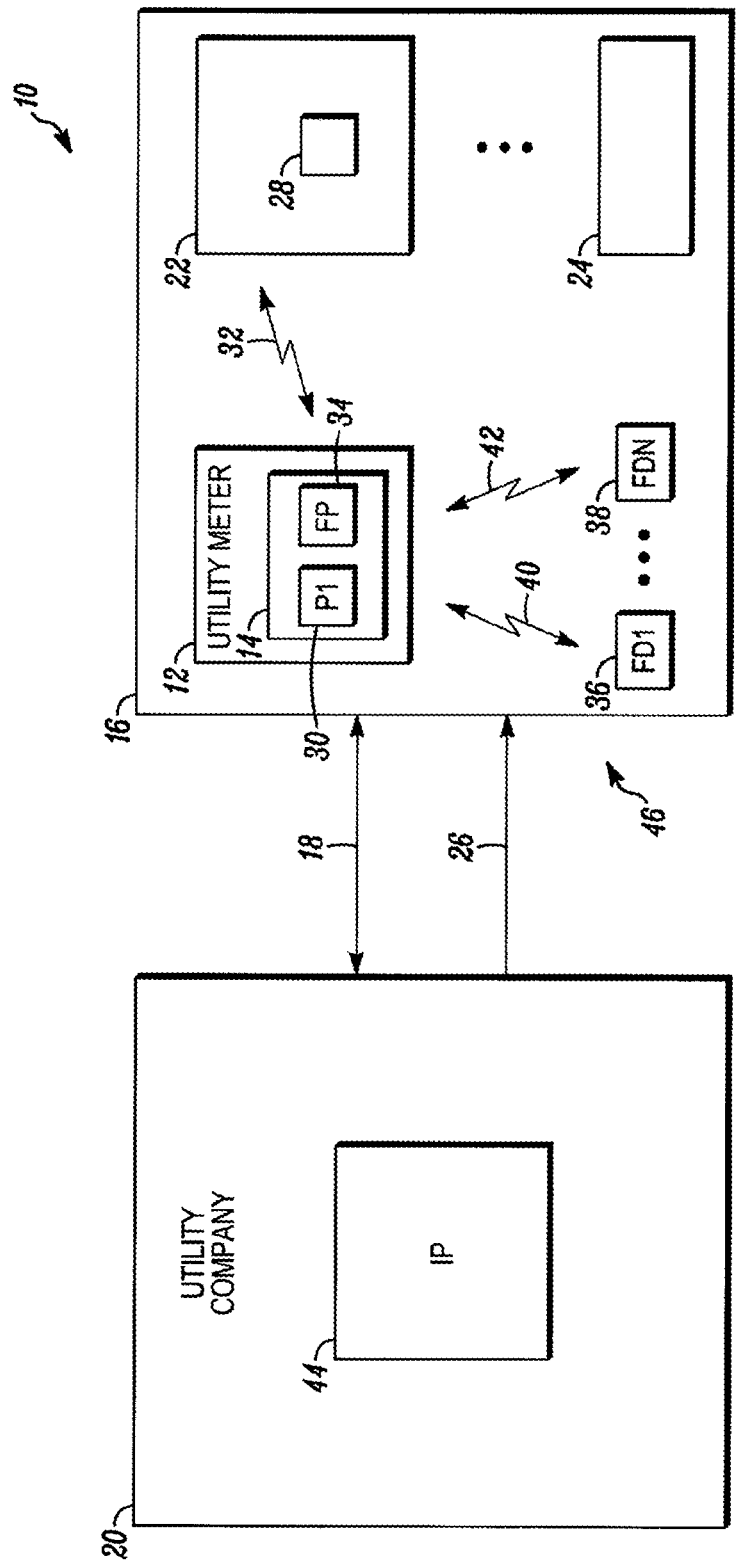
FIG. 1 illustrates a block diagram of a utility meter system including a utility meter, in accordance with an embodiment.

FIG. 1 illustrates a block diagram of a utility meter system 10 shown in a context of use, and generally in accordance with an embodiment. As shown in FIG. 1, the utility meter system 10 can include a utility meter 12 and an associated radio frequency transceiver and processor 14. The utility meter system 10 may be implemented, for example, as a 'smart' meter system. The utility meter system 10 can be, for example, an electric meter system, a water meter system, a gas meter system, and so on. Note that the term 'meter system' as utilized herein can also be referred to simply as a 'meter'. The term 'meter' as utilized herein relates to devices, which can control and regulate electricity and/or natural gas. Examples of meters include an 'electric meter' (or 'electricity meter') and a 'gas meter'. Such devices may also be referred to as simply 'meters' or 'metering devices'.

The utility meter system 10 can be located within a space (e.g., a residence) 16 of a subscriber (e.g., a user) of the utility. In use, a utility company 20 may provide a utility 26 to the user space 16 through the utility meter 12 where the utility 26 can be consumed within one or more utility consuming devices 22, 24. While only one utility company 20 and smart meter system 10 is shown in FIG. 1, it should be understood that a separate utility company 20 and smart meter system 10 may be provided for each electric, natural gas and water utility service. Similarly, the utility consuming devices 22, 24 could be any combination of utility consuming devices (e.g., lighting, gas or electric heating devices, clothes or dish washing machine, etc.).

The transceiver 14 of the utility meter system 10 may be coupled to the utility company 20 via a communication network 18. The communication network 18 may include the use of any of a number of different communication system technologies (e.g., cellular/pager networks, licensed radio, combination licensed and unlicensed radio, power line communications, etc.). In the case of a residential use, the transceivers 14 of a number of spaces 16 within a neighborhood may be combined via a mesh network and connected at a common connection point to the utility company 20 through the use of a wireline connection of a public communication network.

In some ways the utility meter system 10 may operate conventionally. For example, a first, usage processor 30 within the transceiver 14 may be provided with a unique system identifier (e.g., electronic serial number, URL, etc.) that can allow the transceiver 14 to receive meter read messages from an information processor 44 of the utility company 20 instructing the processor 30 read the utility meter 12. The meter read messages may include requests for cumulative readings or for consumption rates in units per time period (e.g., kilowatt/sec, gallons/sec, cubic feet of gas/sec, etc.), if the meter 12 is capable of providing such readings. Alternatively, the processor 30 may be programmed to periodically report a reading under a cumulative or instantaneous format.

The processor 30 may also receive load-shedding instructions from the utility company 20. For example, in the case of an electric utility 20, the load shedding instruction may cause the processor 30 to transmit an instruction 32 to a controller 28 of an air conditioner 22 instructing the air conditioner 22 to shut-down for a predetermined period (e.g., 30) minutes during periods of heavy utility loading.

The transceiver 14 may also include processing features that can operate to provide additional functionality. In this regard, the utility meter system 10 may be used for reporting faults within the space where the faults are associated with use of the utility 26. For example, the use of natural gas in the space 16 may result in a fault such as leaking natural gas where a pilot light goes out or a burner fails to properly ignite. The ability to detect gas leaks within the space 16 has a tremendous advantage in terms of reducing liability for the gas company and for the safety of the user and neighbors of the user.

Similarly, where the utility is water, then the ability to detect a fault (e.g., a water leak caused by a broken hose of a clothes washer, dishwasher, etc.) is also of value. In temperate climates, the ability of an electric utility to detect a fault such as freezing temperatures in the space 16 caused by failure of an electric heater is also of value.

Under this illustrated embodiment, one or more wireless fault sensors 36, 38 may be provided within the space 16. The sensors 36, 38 may be natural gas leak detectors, water leak detectors or even freeze detectors depending upon the utility provided by the company 20.

In this case, a fault processor 34 may be provided within the utility meter system 10 for purposes of detecting faults. When a fault detector 36, 38 detects a fault, the sensor may transmit a wireless fault signal 40, 42 to the fault processor 34 along with its own unique identifier. The fault processor 34, in turn, may compose a message (including the unique system identifier of the transceiver 14) and send the message to the company 20. Upon receipt of the message, the company 20 may take the appropriate action (e.g., send a service vehicle, alert a local fire department or police, etc.).

The fault detectors 36, 38 and processor 34 may be structured to operate in any of a number of different ways. Under one illustrated embodiment, the fault detectors 36, 38 and processor 34 may be small low-power radios and processors operating within a mesh network 46 under a mesh networking standard (e.g., ZigBee type devices based upon IEEE 802.15.4-2003 or equivalent).

Within the mesh, the processor 34 may periodically poll the detectors 36, 38. The detectors 36, 38 may respond with an acknowledgement message or with a fault message.

In the case where the detectors 36, 38 respond with a fault message, the processor 34 may save the fault message along with an identifier of the sensor 36, 38 that reported the fault. The processor 34 may wait for the next request for information from the utility company 20 or may report the fault immediately.

Alternatively, the processor 34 may retrieve a current usage level saved by the usage processor 30 and compare the current usage against some minimum threshold as a means of avoiding false alarms. Comparing the current usage against the minimum threshold may be used to avoid reporting a fault when the detected condition may be due to some other factor. For example, the detector 36, 38 may be intended to be used to detect water leaks for the benefit of a water utility company 20. However, the detector 36, 38 may also detect water due to heavy rains entering a basement. In this case, if a current usage does not exceed the minimum threshold (e.g., the owners of a resident 16 are away for the weekend and are not using any water), then the fault would not be reported to the utility company 20 or the fault may be reported along with indication that there is no current water usage.

The meter 12 may be, for example, an electric meter or electricity meter. As utilized herein, the term 'electricity meter' can relate to a device that measures and/or meters aspects of energy provided to a load. The load may be a residence, business, or even part of a larger electricity distribution system. Commonly available meters include electromechanical meters and electronic meters. Electromechanical meters can employ a rotating disk that rotates in response to electric and magnetic fields induced by the electricity passing to the load. The disk rotation speed is a function of the amount of electricity delivered to the load. Mechanical counters accumulate the number of disk rotations, which is indicative of energy consumed by the load. In some cases, an electromechanical meter can employ processing circuitry to perform additional operations with the consumption information provided by the rotating disk.

An electronic meter can employ processing circuitry instead of the rotating disk and mechanical counters. In such meters, sensors within the meter detect the voltage and current that is delivered to the load. Circuitry within the meter converts the sensed voltage and current into digital values. Processing circuitry can then employ digital signal processing to calculate, for example, consumed energy, among other things, from the digital values. Electronic meters can provide greater flexibility in the types of energy consumption information that they may calculate, track, and store.

Figure 2:
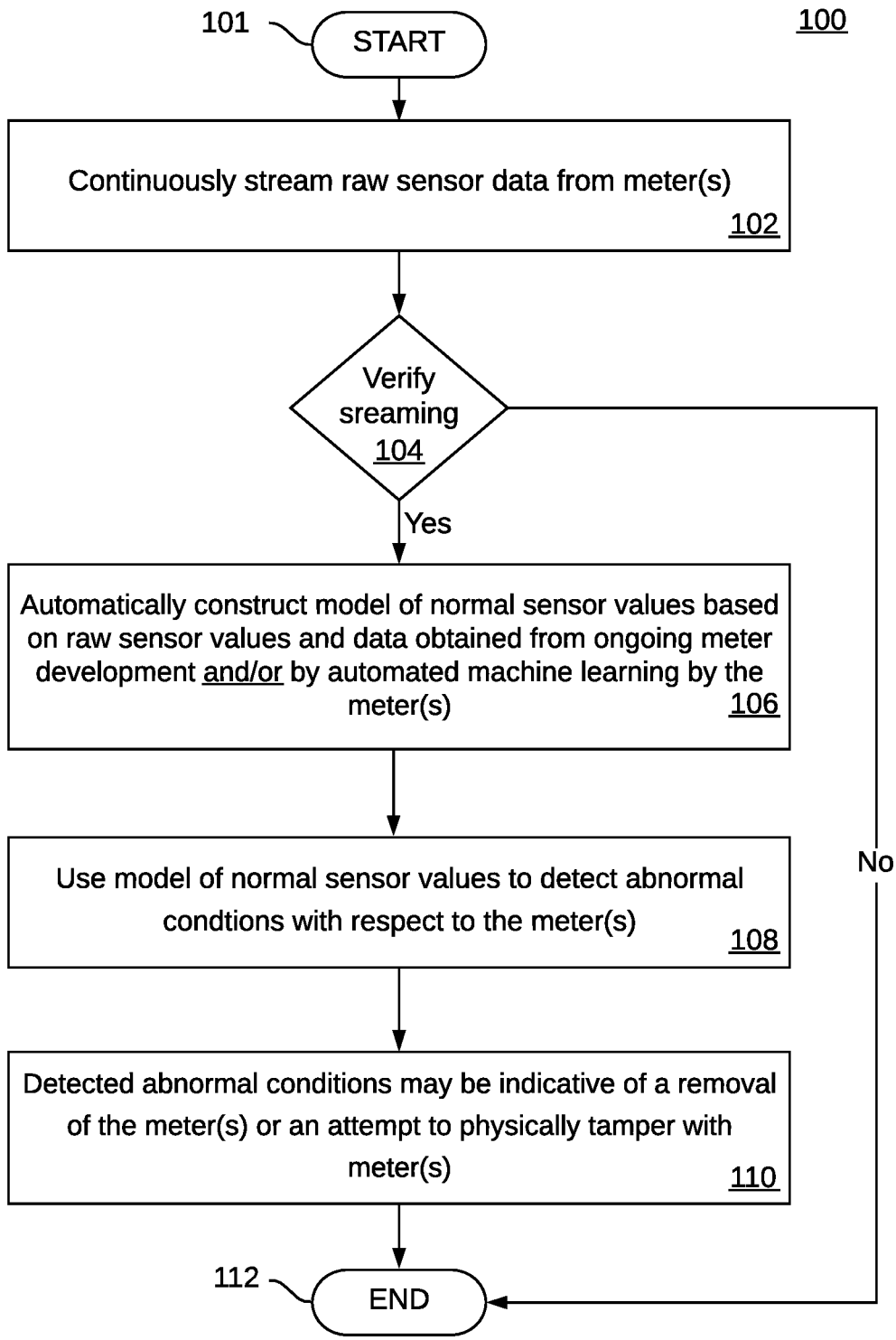
FIG. 2 illustrates a flow chart of operations depicting logical operational steps of a method for detecting tampering of a meter such as the meter depicted in FIG. 1, in accordance with an embodiment.

FIG. 2 illustrates a flow chart of operations depicting logical operational steps of a method 100 for detecting tampering of a meter such as the meter 12 depicted in FIG. 1, in accordance with an embodiment. As depicted at block 101, the process can begin. Next, as shown at block 102, a step or operation can be implemented in which a continuous stream of raw sensor values can be received from one or meters such as the meter 12. Thereafter, as shown at decision block 104, a step or operation can be implemented in which a test can be performed to determine if the continuous stream of raw sensor values has been received from meter 12 (and/or other meters). If not, then the process can terminate, as shown at block 112.

Note that as utilized herein, the term 'raw sensor values' can refer to raw sensor data. The term 'sensor data' can refer to the output of a device that can detect and respond to some type of input from the physical environment. The output may be used to provide information or input to another system or to guide a process. Thus, 'raw sensor data' can refer to sensor data provided by a sensor such as the meter 12 that has not yet been subject to filtering and/or processing. The data or values at this point are considered to be 'raw' and not yet subject to any other actions.

If it is determined that the continuous stream of raw sensor values has been received as depicted at block 112, then in response to receiving the continuous stream of raw sensor values from the meter 12, a step or operation can be implemented as illustrated at block 108 to automatically construct a model of normal sensor values for each the meter 12 (and/or other meters) based on the raw sensor values obtained from meter 12 (and/or obtained from other meters) and also based on data obtained through ongoing development of the meter 12 and/or through automated machine learning by the meter 12.

Note that the term 'normal' in the context of normal sensor values can relate to a range considered safe or optimal such as a safe or optimal functioning range of the meter 12. Thus, the term 'normal sensor values' may relate to safe or optimal sensor values associated with the meter 12 (and/or other meters).

Likewise, the terms 'abnormal sensor data' and 'abnormal' and variations therefore, as utilized herein can refer to sensor values or sensor data including events that operate outside of a safe or optimal sensor range. The term 'abnormal' as utilized herein may also refer to data that is anomalous (e.g., anomalous sensor data or anomalous sensor values) including abnormal conditions with respect to the meter 12. In addition, the term 'model' as utilized herein can relate to a computer-based model (e.g., a computer program) that can be designed to simulate what might or what did happen in a situation. The term 'model' as utilized herein can further involve computer modeling such as the use of a numerical analysis to approximate a real solution of a problem. Simulation techniques can be then used to obtain values.

Following processing of the step or operation shown at block 108, a step or operation can be implemented in which the model of normal sensor values can be used to detect abnormal conditions with respect to the meter(s). The detected abnormal conditions with respect to the meter 12 are thus potentially indicative of a removal of the meter 12 or an attempt by someone to physically tamper with the meter 12, as shown at block 110.

Note that as utilized herein, the term 'model' can relate to a simplification of something or a process. In some embodiments, the model may be implemented as an AI (Artificial Intelligence) model. The term AI or 'Artificial Intelligence' can include, for example, machine-learning applications. An AI model can replicate a decision process to enable automation and understanding. Such an AI model (e.g., AI/machine learning) model can involve mathematical algorithms that can be "trained" using data and/or human expert input to replicate a decision an expert would make when provided that same information.

In machine learning, the term 'model' can refer to a mathematical expression of model parameters along with input placeholders for each prediction, class and action for regression, classification and reinforcement categories respectively. This expression can be embedded in the single neuron as a 'model'. For single layer perceptron and deep learning models, one needs to extract this model by carefully walking the neurons and layers to collect and stitch an activation function in an ordered fashion.

In machine learning, a model can be an abstraction that can perform a prediction, a (re-)action or a transformation to or in respect of an instance of input values. A model may be a single number such as a mean value of a set of observations, which can be used as a baseline model, a polynomial expression or a set of rules (e.g. decision tree) that can define how to get to generate the output.

A model can be defined by a set of rules and hyperparameters that can define the model's structure and capacity to be optimized to perform the task at hand. A hyperparameter can be the degree of the polynomial or the depth of the decision tree. A model can be subjected to an optimization process where parameters can be optimized against a certain objective. The optimization process is often referred to as training for fitting and results in a fitted model, which also can be simply referred to as model. If a model was trained or not may need to be deduced from the context.

Instead of needing to determine a priori a suitable threshold, and instead of using a global common default threshold, the disclosed approach involves building a model of "normal" sensor values for each individual meter automatically, and then using this model to detect "abnormal" conditions. This model can be built or constructed within the meter or within external software. The step or operation discussed above with respect to block 106, for example, can involve the building of the model within the meter or within external software.

Building the model externally for each meter such as meter 12 can involve communicating the raw sensor values from the meter 12 to some external entity, but would allow the use of data not available inside the meter (e.g., weather data). The model can take not only the raw sensor data into account, but also any other available data that might be found to be relevant during continued development or through automated machine learning processes as discussed above.

Examples of potentially relevant data can include data indicative of temperature, outages at nearby meters—particularly on the same transformer or feeder, weather data (e.g., lightning strikes produce thunder which can vibrate meters), and so on. Current and historical values associated with the meter 12 (and other meters) may be used to create the model.

At the simple end of the scale, measuring the vibration or acceleration rate at a meter and setting the normal threshold to be the 90th percentile of those values is an example of a model that can be continuously updated by the meter 12, is easy to calculate, and allows adaptation to local conditions. At the complex end of the scale, a cloud software system may use any number of unsupervised machine learning algorithms to determine "normal" conditions at a meter based on sensor values and other input.

Figure 3:
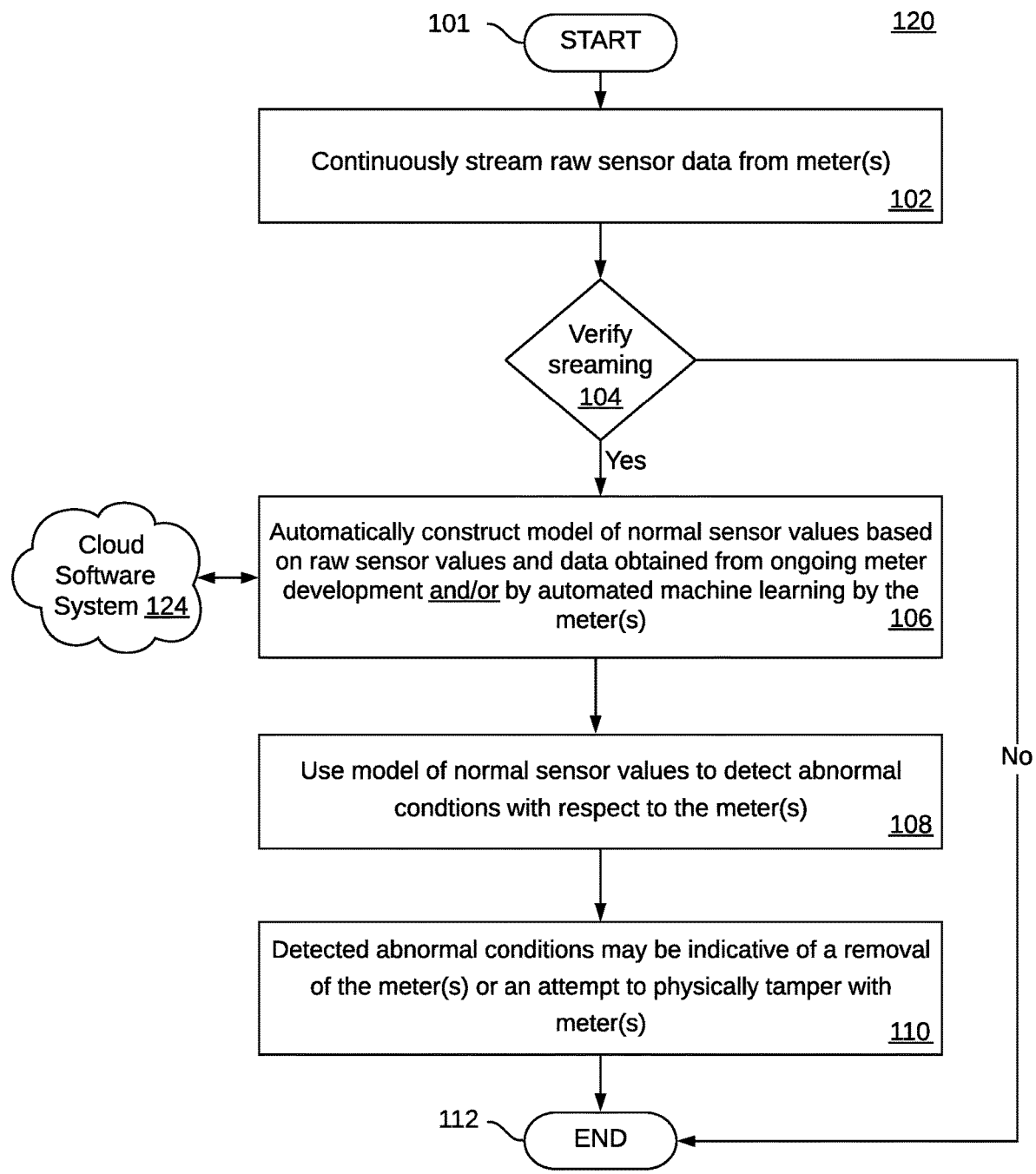
FIG. 3 illustrates a flow chart of operations depicting logical operational steps of a method for detecting tampering of a meter such as the meter depicted in FIG. 1, in accordance with an alternative embodiment.

FIG. 3, for example, illustrates a flow chart of operations depicting logical operational steps of a method 120 for detecting tampering of a meter such as the meter 12 in accordance with an alternative embodiment. The method 120 shown in the alternative embodiment of FIG. 3 is similar to the method 100 depicted in FIG. 1, with the inclusion of a cloud software system 124, which the operational step shown at block 106 may have access to for constructing the model of normal sensor values. Note that identical or similar reference numerals utilized herein with respect to the drawings and figures can refer to identical or similar parts or elements.

As an example, a clustering algorithm or a pattern recognition algorithm may be provided by the cloud software system 124 for building or constructing a model that can determine the "distance" of current sensor input from the normal model and a threshold based on deviation from some mean. This activity can occur as a part of the operational step shown at block 106. The term 'cloud' software system 124 can relate to 'cloud computing' which can refer to both the applications that can be delivered as services over the Internet and the hardware and systems software in the data centers that can provide those services. The services themselves have long been referred to as Software as a Service (SaaS). The aforementioned clustering algorithm or pattern recognition algorithm, for example, can be offered by a SaaS module provided the cloud software system 124.

Note that the disclosed embodiments are not specific to any particular modeling algorithm, but to the creation of a unique model for each device based on its local conditions that detect abnormalities using these meter removal sensing technologies and to the system that facilitates such model building and used to detect abnormal conditions that might indicate a meter removal. As discussed previously, the model can built/constructed from a continuous stream of sensor values, then at the time of power fail (or voltage drop) the current sensor values (and possibly the recent history) can be compared against the model to determine if the meter is being moved.

Figure 4:
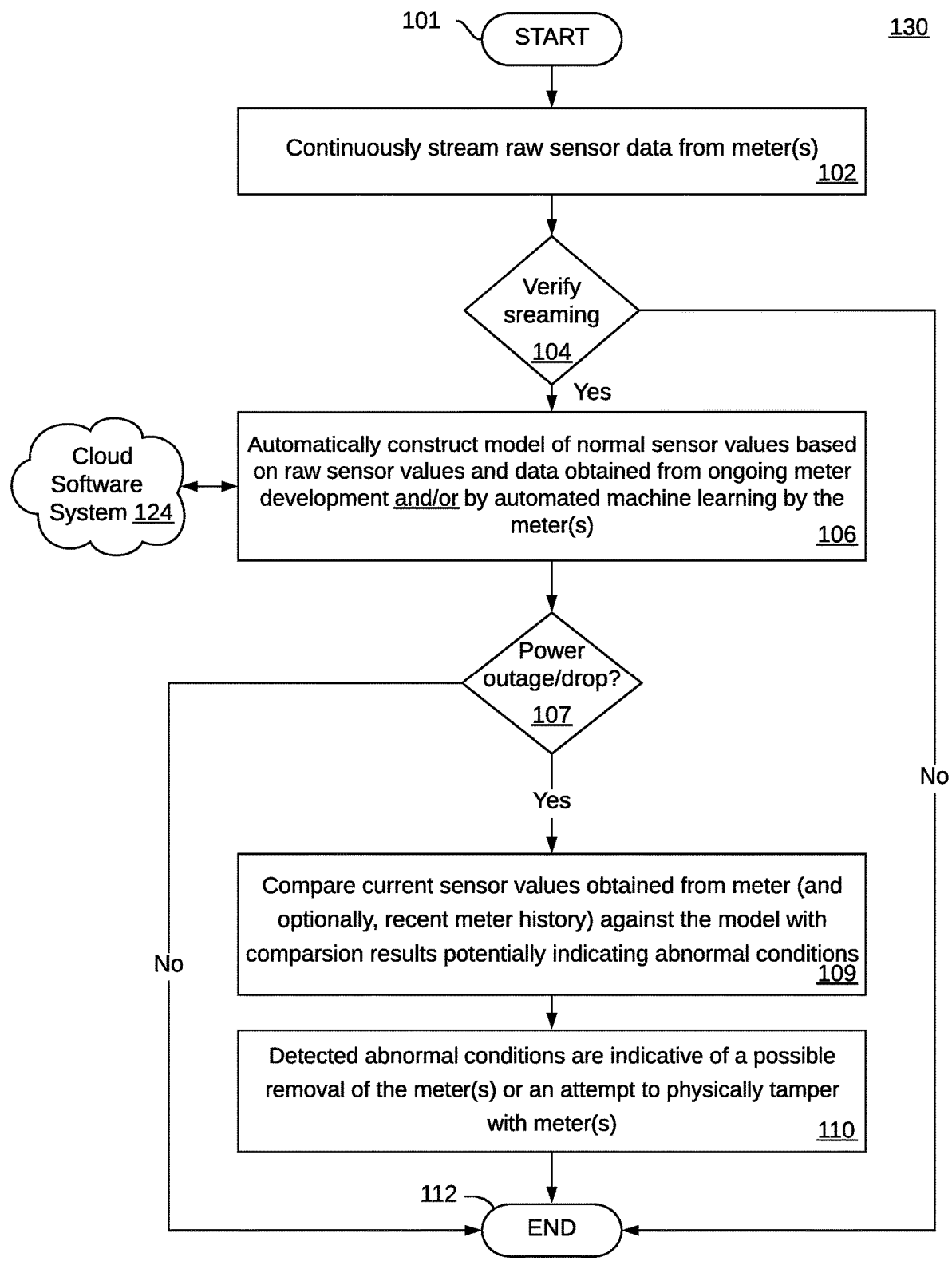
FIG. 4 illustrates a flow chart of operations depicting logical operational steps of a method for detecting tampering of a meter such as the meter depicted in FIG. 1, in accordance with another embodiment.

FIG. 4 illustrates a flow chart of operations depicting logical operational steps of a method 130 for detecting tampering of a meter such as the meter depicted in FIG. 1, in accordance with another embodiment. The alternative method 130 depicted in FIG. 4 is similar to the method 100 shown in FIG. 2 and the method 120 illustrated in FIG. 3, with the exception of the inclusion of the steps or operations depicted at decision block 107 and block 109.

As shown at block 107, a test can be performed to determine if a power fail (or power drop) has been detected with respect to the meter 12 and/or the utility meter system 10. If a power fail (or power drop) is not detected, then the process simply ends, as shown at block 112. If a power fail (or power drop) is detected with respect to the method 12 and/or the utility meter system 10, then as shown at block 109, a step or operation can be implemented comparing the current sensor values (and possibly the recent history) against the aforementioned model to determine if the meter 12 is being moved and/or tampered.

As can be appreciated by one skilled in the art, embodiments can be implemented in the context of a method, data processing system, or computer program product. Accordingly, embodiments may take the form of an entirely hardware embodiment, an entirely software embodiment or an embodiment combining software and hardware aspects all generally referred to herein as a "circuit" or "module." Furthermore, embodiments may in some cases take the form of a computer program product on a computer-usable storage medium having computer-usable program code embodied in the medium. Any suitable computer readable medium may be utilized including hard disks, USB Flash Drives, DVDs, CD-ROMs, optical storage devices, magnetic storage devices, server storage, databases, etc.

Computer program code for carrying out operations of the present invention may be written in an object oriented programming language (e.g., Java, C++, etc.). The computer program code, however, for carrying out operations of particular embodiments may also be written in procedural programming languages, such as the "C" programming language or in a visually oriented programming environment, such as, for example, Visual Basic.

The program code may execute entirely on the meter, partly on the meter, as a stand-alone software package, partly on the meter and partly on a remote computer or entirely on the remote computer. In the latter scenario, the remote computer may be connected to a meter through a bidirectional data communications network such as a local area network (LAN) or a wide area network (WAN), a wireless local area network (WLAN), wireless data network e.g., Wi-Fi, Wimax, 802.xx, and/or a cellular network or the bidirectional connection may be made to an external computer via most third party supported networks (for example, through the Internet utilizing an Internet Service Provider).

The embodiments are described at least in part herein with reference to flowchart illustrations and/or block diagrams of methods, systems, and computer program products and data structures according to embodiments of the invention. It will be understood that each block or feature of the illustrations, and combinations of blocks or features, can be implemented by computer program instructions. These computer program instructions may be provided to a processor of, for example, a general-purpose computer, special-purpose computer, or other programmable data processing apparatus to produce a machine, such that the instructions, which execute via the processor of the computer or other programmable data processing apparatus, create means for implementing the functions/acts specified in the block or blocks or elsewhere herein. To be clear, the disclosed embodiments can be implemented in the context of, for example a special-purpose computer or a general-purpose computer, or other programmable data processing apparatus or system. For example, in some embodiments, a data processing apparatus or system can be implemented as a combination of a special-purpose computer and a general-purpose computer.

These computer program instructions may also be stored in a computer-readable memory that can direct a computer or other programmable data processing apparatus to function in a particular manner, such that the instructions stored in the computer-readable memory produce an article of manufacture including instruction means which implement the function/act specified in the various block or blocks, flowcharts, and other architecture illustrated and described herein.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide steps for implementing the functions/acts specified in the block or blocks.

The flowchart and block diagrams in the figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 5:
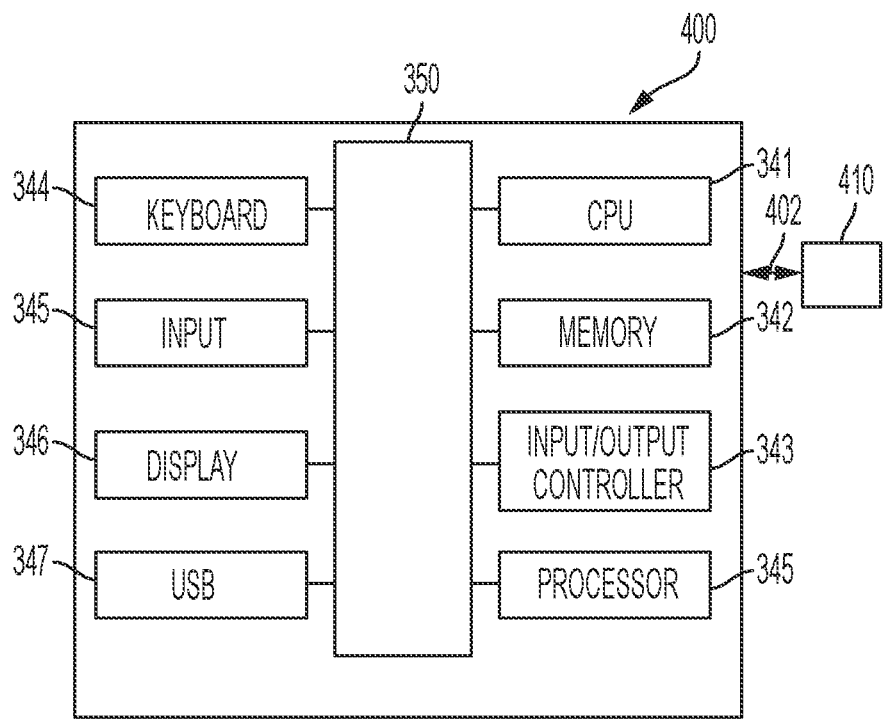
FIG. 5 illustrates a schematic view of a data-processing system, in accordance with an embodiment.
Figure 6:
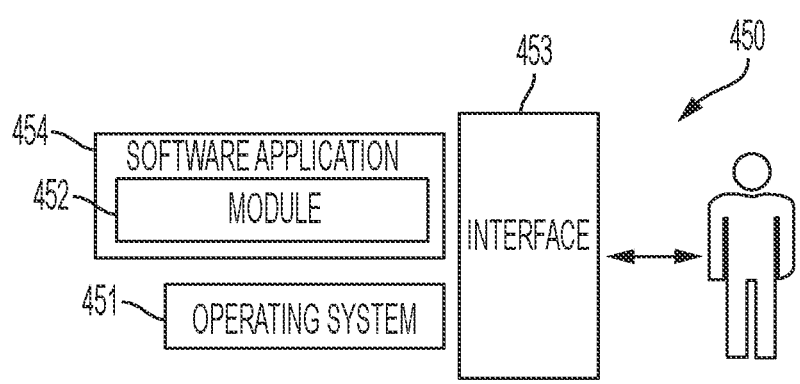
FIG. 6 illustrates a schematic view of a software system that can include a module, an operating system, and a user interface, in accordance with an embodiment.

FIG. 5 and FIG. 6 are shown only as exemplary diagrams of data-processing environments in which example embodiments may be implemented. It should be appreciated that FIG. 5 and FIG. 6 are only exemplary and are not intended to assert or imply any limitation with regard to the environments in which aspects or embodiments of the disclosed embodiments may be implemented. Many modifications to the depicted environments may be made without departing from the spirit and scope of the disclosed embodiments.

As illustrated in FIG. 5, some embodiments may be implemented in the context of a data-processing apparatus 400 that can include, for example, one or more processors such as a CPU (Central Processing Unit) 341 and/or other another processor 349 (e.g., microprocessor, microcontroller etc), a memory 342, an input/output controller 343, a peripheral USB (Universal Serial Bus) connection 347, a keyboard 344 and/or another input device 345 (e.g., a pointing device, such as a mouse, track ball, pen device, etc.), a display 346 (e.g., a monitor, touch screen display, etc) and/or other peripheral connections and components.

As illustrated, the various components of data-processing apparatus 400 can communicate electronically through a system bus 351 or similar architecture. The system bus 351 may be, for example, a subsystem that transfers data between, for example, computer components within data-processing apparatus 400 or to and from other data-processing devices, components, computers, etc. The data-processing apparatus 400 may be implemented in some embodiments as, for example, a server in a client-server based network (e.g., the Internet) or in the context of a client and a server (i.e., where aspects are practiced on the client and the server). In other embodiments, the data-processing apparatus 400 may be implemented as a cloud-based server as part of the cloud software system 124. The data-processing apparatus 400 may be utilized in association with or as part of a utility meter system such as the utility meter system 10 shown in FIG. 1.

In some example embodiments, the data-processing apparatus 400 may be, for example, a standalone desktop computer, a laptop computer, a smartphone, a tablet computing device, a networked computer server, and so on, wherein each such device can be operably connected to and/or in communication with a client-server based network or other types of networks (e.g., cellular networks, Wi-Fi, etc). The data-processing apparatus 400 can communicate with other devices such as, for example, an electronic device 410. An example of the electronic device 410 is the utility meter 10 and/or the utility meter system 12 discussed previously herein with respect to FIG. 1. Communication between the data-processing apparatus 400 and the electronic device 410 can be bidirectional, as indicated by the double arrow 402. Such bidirectional communications may be facilitated by, for example, a computer network, including wireless bidirectional data communications networks.

FIG. 6 illustrates a computer software system 450 for directing the operation of the data-processing apparatus 400 depicted in FIG. 5. Software application 454, stored for example in the memory 342 can include one or more modules such as module 452. The computer software system 450 also can include a kernel or operating system 451 and a shell or interface 453. One or more application programs, such as software application 454, may be "loaded" (i.e., transferred from, for example, mass storage or another memory location into the memory 342) for execution by the data-processing apparatus 400. The data-processing apparatus 400 can receive user commands and data through the interface 453; these inputs may then be acted upon by the data-processing apparatus 400 in accordance with instructions from operating system 451 and/or software application 454. The interface 453 in some embodiments can serve to display results, whereupon a user 459 may supply additional inputs or terminate a session. The software application 454 can include module(s) 452, which can, for example, implement instructions, steps or operations such as those discussed herein. Module 452 may also be composed of a group of modules and/or sub-modules, which may implement instructions such as the various steps and operations set forth herein (e.g., method 100 shown in FIG. 2, method 120 shown in FIG. 3, and method 130 shown in FIG. 4).

The following discussion is intended to provide a brief, general description of suitable computing environments in which the system and method may be implemented. The disclosed embodiments can be described in the general context of computer-executable instructions, such as program modules, being executed by a single computer. In most instances, a "module" can constitute a software application, but can also be implemented as both software and hardware (i.e., a combination of software and hardware).

Generally, program modules include, but are not limited to, routines, subroutines, software applications, programs, objects, components, data structures, etc., that can perform particular tasks or which can implement particular data types and instructions. Moreover, those skilled in the art will appreciate that the disclosed method and system may be practiced with other computer system configurations, such as, for example, hand-held devices, multi-processor systems, data networks, microprocessor-based or programmable consumer electronics, networked PCs, minicomputers, mainframe computers, servers, and the like.

Note that the term module as utilized herein may refer to a collection of routines and data structures that perform a particular task or implements a particular data type. Modules may be composed of two parts: an interface, which lists the constants, data types, variable, and routines that can be accessed by other modules or routines, and an implementation, which may be private (e.g., accessible only to that module) and which can include source code that actually implements the routines in the module. The term module can also relate to an application, such as a computer program designed to assist in the performance of a specific task, such as implementing the methods, steps and operations previously discussed herein.

It can be appreciated that the technical solutions described herein are rooted in computer technology, particularly using reinforced learning frameworks such as machine learning and AI algorithms. Further, the technical solutions described herein are also related to utility meter systems. The technical solutions described herein can improve such technology including related computer technologies by providing the one or more advantages described throughout the present disclosure by improving the performance of the utility meter system (e.g., by preventing or discouraging unauthorized removal or tampering of the utility meter system) and specific devices such as a utility meter.

The disclosed approach represents a concrete and non-abstract improvement over conventional systems. By developing an AI model for each meter and based on local conditions that detect abnormalities using meter removal sensing technologies, improvements can be achieved in the detection and identification of meter abnormalities. The model can be built from a continuous stream of sensor values. At the time of power fail, (or voltage drop) current sensor values and historical sensor data can be compared against the model to determine if the meter is being moved. The model may be built within the meter or within external software. The embodiments represent specific, concrete and highly relevant proposed solutions to the technical problem (i.e., they are non-abstract) of false positives in the field, along with the problem of a lack of a globally "correct" threshold, and the lack of methods, systems and devices for determining the threshold a-priori.

Based on the foregoing, it can be appreciated that a number of embodiments, including preferred and alternative embodiments, are disclosed herein. For example, in an embodiment, a method for detecting tampering of a meter, can involve: receiving a continuous stream of raw sensor values from at least one meter among a plurality of meters; in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

An embodiment of the method can further involve detecting the abnormal conditions with respect to the at least one meter by comparing abnormal conditions against the model of normal sensor values.

In an embodiment of the method, the at least one meter can comprise an electrical meter.

In an embodiment of the method, the at least one meter can comprise a gas meter.

In an embodiment of the method, the at least one meter can comprise at least one of: an electrical meter and/or a gas meter.

In an embodiment of the method, the model of normal sensor values can be further constructed based on data obtained external to the at least one meter.

In an embodiment of the method, the data obtained external to the at least one meter can comprise at least one of: temperature data; weather data; and outage data associated with meters located near the at least one meter.

In another embodiment, a system for detecting tampering of a meter, can include at least one processor and a non-transitory computer-usable medium embodying computer program code, the computer-usable medium capable of communicating with the at least one processor. The computer program code can include instructions executable by the at least one processor and operable for: receiving a continuous stream of raw sensor values from at least one meter among a plurality of meters; in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

In an embodiment of the system, the instructions can be further operable for detecting the abnormal conditions with respect to the at least one meter by comparing abnormal conditions against the model of normal sensor values.

In an embodiment of the system, at least one meter can comprise an electrical meter.

In an embodiment of the system, the at least one meter can comprise a gas meter.

In an embodiment of the system, the at least one meter can comprise at least one of: an electrical meter and/or a gas meter.

In an embodiment of the system, the model of normal sensor values can be further constructed based on data obtained external to the at least one meter.

In an embodiment of the system, the data obtained external to the at least one meter can comprise at least one of: temperature data, weather data, and outage data associated with meters located near the at least one meter.

In still another embodiment, a utility meter system for detecting tampering of a meter, can include: at least one meter among a plurality of meters, wherein a continuous stream of raw sensor values is received from the at least one meter among the plurality of meters; a model of normal sensor values, wherein in response to receiving the continuous stream of raw sensor values from the at least one meter, the model of normal sensor values is automatically constructed for each meter among the plurality of meters based on the raw sensor values obtained from the at least one meter among the plurality of meters and based on data obtained through an ongoing development of the at least one meter or through automated machine learning by the at least one meter; wherein the model of normal sensor values is used to detect abnormal conditions with respect to the at least one meter; and wherein at least some of the abnormal conditions detected with respect to the at least one meter are potentially indicative of a removal of the at least one meter or of an attempt to physically tamper with the at least one meter.

In an embodiment of the utility meter system, the abnormal conditions with respect to the at least one meter can be detected by comparing abnormal conditions against the model of normal sensor values.

In an embodiment of the utility meter system, the model of normal sensor values can be further constructed based on data obtained external to the at least one meter.

In an embodiment of the utility meter system, the at least one meter can comprise at least one of an electrical meter and/or a gas meter.

In an embodiment of the utility meter system, the data obtained external to the at least one meter can comprise one or more of: temperature data, weather data, and outage data associated with meters located near the at least one meter.

It will be appreciated that variations of the above-disclosed embodiments and examples and other features and functions, or alternatives thereof, may be desirably combined into many other different systems or applications. It will also be appreciated that various presently unforeseen or unanticipated alternatives, modifications, variations or improvements therein may be subsequently made by those skilled in the art which are also intended to be encompassed by the following claims.

What is claimed is:

1. A method for detecting tampering of a meter, comprising:
   receiving a continuous stream of raw sensor values from at least one meter among a plurality of meters;
   in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and
   using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

2. The method of claim 1 further comprising detecting the abnormal conditions with respect to the at least one meter by comparing abnormal conditions against the model of normal sensor values.

3. The method of claim 1 wherein the at least one meter comprises an electrical meter.

4. The method of claim 1 wherein the at least one meter comprises a gas meter.

5. The method of claim 1 wherein the at least one meter comprises at least one of: an electrical meter; and
   a gas meter.

6. The method of claim 1 wherein the model of normal sensor values is further constructed based on data obtained external to the at least one meter.

7. The method of claim 6 wherein the data obtained external to the at least one meter comprises at least one of:
   temperature data;
   weather data; and
   outage data associated with meters located near the at least one meter.

8. A system for detecting tampering of a meter, comprising:
   at least one processor; and
   a non-transitory computer-usable medium embodying computer program code, the computer-usable medium capable of communicating with the at least one processor, the computer program code comprising instructions executable by the at least one processor and operable for:
      receiving a continuous stream of raw sensor values from at least one meter among a plurality of meters;
      in response to receiving the continuous stream of raw sensor values from the at least one meter, automatically constructing a model of normal sensor values for each meter among the plurality of meters based on the raw sensor values obtained from the at least one meter among the plurality of meters and based on data obtained through an ongoing development of the at least one meter or through automated machine learning by the at least one meter; and
      using the model of normal sensor values to detect abnormal conditions with respect to the at least one meter, wherein at least some of the abnormal conditions detected with respect to the at least one meter are potentially indicative of a removal of the at least one meter or of an attempt to physically tamper with the at least one meter.

9. The system of claim 8 wherein the instructions are further operable for detecting the abnormal conditions with respect to the at least one meter by comparing abnormal conditions against the model of normal sensor values.

10. The system of claim 8 wherein the at least one meter comprises an electrical meter.

11. The system of claim 8 wherein the at least one meter comprises a gas meter.

12. The system of claim 8 wherein the at least one meter comprises at least one of: an electrical meter; and
    a gas meter.

13. The system of claim 8 wherein the model of normal sensor values is further constructed based on data obtained external to the at least one meter.

14. The system of claim 13 wherein the data obtained external to the at least one meter comprises at least one of:
    temperature data;
    weather data; and
    outage data associated with meters located near the at least one meter.

15. A utility meter system for detecting tampering of a meter, comprising:
    at least one meter among a plurality of meters, wherein a continuous stream of raw sensor values is received from the at least one meter among the plurality of meters;
    a model of normal sensor values,
      wherein in response to receiving the continuous stream of raw sensor values from the at least one meter, the model of normal sensor values is automatically constructed for each meter among the plurality of meters based on the raw sensor values obtained from the at least one meter among the plurality of meters and based on data obtained through an ongoing development of the at least one meter or through automated machine learning by the at least one meter;
      wherein the model of normal sensor values is used to detect abnormal conditions with respect to the at least one meter; and
      wherein at least some of the abnormal conditions detected with respect to the at least one meter are potentially indicative of a removal of the at least one meter or of an attempt to physically tamper with the at least one meter.

16. The utility meter system of claim 15 wherein the abnormal conditions with respect to the at least one meter are detected by comparing abnormal conditions against the model of normal sensor values.

17. The utility meter system of claim 16 wherein the model of normal sensor values is further constructed based on data obtained external to the at least one meter.

18. The utility meter system of claim 15 wherein the at least one meter comprises at least one of: an electrical meter; and a gas meter.

19. The utility meter system of claim 15 wherein the model of normal sensor values is further constructed based on data obtained external to the at least one meter.

20. The utility meter system of claim 19 wherein the data obtained external to the at least one meter comprises at least one of:

temperature data;
weather data; and
outage data associated with meters located near the at least one meter.

* * * * *